United States Patent [19]

Kerber et al.

[11] Patent Number: 4,689,496

[45] Date of Patent: Aug. 25, 1987

[54] TWO CLOCK BOOT CIRCUIT

[75] Inventors: William O. Kerber, Escondido; Roger W. Boates, San Diego; Ikuo J. Sanwo, San Marcos, all of Calif.

[73] Assignee: NCR Corporation, Dayton, Ohio

[21] Appl. No.: 716,412

[22] Filed: Mar. 27, 1985

[51] Int. Cl.[4] .................... H03K 5/02; H03K 5/135
[52] U.S. Cl. .................... 307/269; 307/578; 307/482
[58] Field of Search ............ 307/481, 482, 270, 582, 307/583, 578, 269, 264, 262, 475; 328/172, 173, 176

[56] References Cited

U.S. PATENT DOCUMENTS

| | | | |
|---|---|---|---|
| 4,352,996 | 10/1982 | White, Jr. | 307/269 |
| 4,431,927 | 2/1984 | Eaton, Jr. et al. | 307/269 |
| 4,443,720 | 4/1984 | Takemae | 307/578 |
| 4,472,644 | 9/1984 | Kirsch | 307/269 |
| 4,540,898 | 9/1985 | Pumo et al. | 307/269 |
| 4,574,203 | 3/1986 | Baba | 307/269 |

Primary Examiner—Stanley D. Miller
Assistant Examiner—Richard Roseen
Attorney, Agent, or Firm—Wilbert Hawk, Jr.; Edward Dugas

[57] ABSTRACT

A plurality of circuit embodiments, implemented in MOS, for receiving two non-overlapping clock signals provide a booting function to each clock signal and in response to respective control signals directs one or the other of the booted clock signals to a single output line. The control signal for the first clock can change during the alternate second clock time and is stable during the first clock time. Similarly, the control signal for the second clock can change during the alternate first clock time and is stable during the second clock time. For both control signals, a low level enables the respective boot circuit.

8 Claims, 10 Drawing Figures

TWO CLOCK BOOT CIRCUIT

BACKGROUND OF THE INVENTION

The present invention relates to bootstrap circuits and more particularly to a circuit which can receive two clock signals and provide corresponding booted clock signals out on a single output line in response to control signals. In semiconductor devices, clock generators are employed which have output driver circuits for driving capacitive loads between a low level, usually ground, and high level, usually the supply voltage. In driving towards the high level using MOS devices, there is encountered a voltage drop of one enhancement threshhold voltage from the supply voltage which is caused by the electrical characteristics of MOS devices. The clocking signal thereby loses some of its amplitude causing deterioration in the operation of circuits which are activated by the clock signal. Bootstrap circuits are used to increase and/or restore the full amplitude of the clock signal. In integrated circuit design, the area required for conductors and devices limits the reduction in size of the chip on which the circuit is implemented and in turn increases the cost and generally decreases the speed of the circuit. It is therefor desirable, if possible, to run two signals over the same line, thereby eliminating the need for one line as long as the two signals do not interfere with each other. Such being the case, the area required to implement a circuit is reduced making for smaller and faster circuits. The present circuit seeks to achieve these advantages when non-overlapping clock signals have to be booted.

Some patents of interest for showing the state of the art for bootstrapping circuits are U.S. Pat. No. 4,352,996 entitled "IGFET Clock Generator Circuit Employing MOS Bootstrap Capacitive Drive" by L. S. White, Jr.; U.S. Pat. No. 4,431,927 entitled "MOS Capacitive Bootstrapping Trigger Circuit for a Clock Generator" by S. S. Eaton, Jr. et al.; and U.S. Pat. No. 4,443,720 entitled "Bootstrap Circuit" by Y. Takemae.

SUMMARY OF THE INVENTION

An object of the present invention is to provide a bootstrapping circuit which operates upon two clocking signals and under signal control provides a combination of either the first or the second clocking signal or both at its output without causing interference between the two clock signals.

It is another object of the present invention to provide a smaller and faster circuit.

The above mentioned objects are achieved in one preferred embodiment of the invention by providing two identical circuit paths for control of the respective clock signals, each circuit path starting with a NOR gate having as inputs the respective control signal and the other clock signal. The output of each NOR gate is directed to a source terminal of a MOS device with the gate of the MOS device connected to the supply voltage. The drain of the MOS device is connected to the gate of a second MOS device with the source of the second MOS device being connected to receive the first clock signal. The drain of the second MOS device is connected to the circuit's output terminal. The similar circuit path for the second clock signal has its output connected to the same output terminal. The output terminal is connected by means of an output MOS device to a reference potential such as ground. A NOR gate connects the output of the first and second NOR gates to the gate of the output MOS device.

In a second embodiment of the invention, the turn off and turn on times of the bootstrapping circuit are assured and the conduction path between the two clock signals through two MOS devices when the clock signals are low is eliminated by cross-coupling the output of each of the NOR gates through AND circuits which are clocked by a flip-flop circuit receiving as toggling inputs the first and second clock signals.

In a third embodiment of the invention there is provided a circuit which is responsive to input signals which are complementary to the input signals for the first and the second embodiments.

The above and other objects of the present invention will become more apparent when taken in conjunction with the following description and drawings wherein like characters indicate like parts and which drawings form a part of the present application.

DETAILED DESCRIPTION OF THE INVENTION

Figure 1:
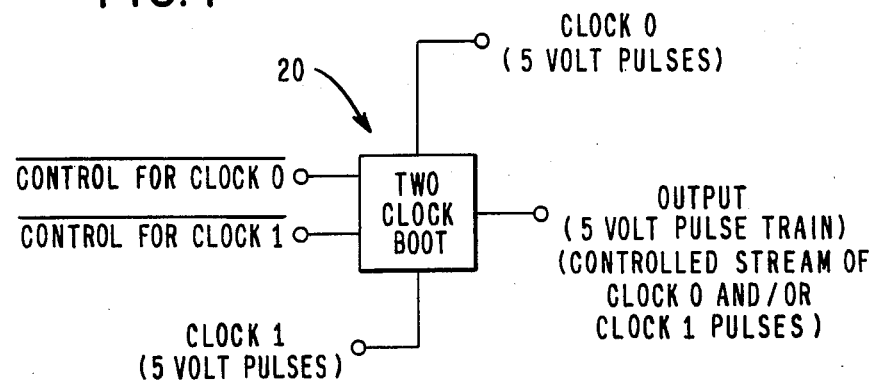
FIG. 1 is a block diagram of the present inventions function.

Referring to FIG. 1, the box labeled 20 represents the circuit of the present invention receiving as inputs the signal $\overline{\text{CONTROL FOR CLOCK 0}}$, the signal $\overline{\text{CONTROL FOR CLOCK 1}}$ and the non-overlapping clock signals, CLOCK 0 and CLOCK 1. The output is taken from the terminal labeled OUTPUT and consists of a five volt pulse train. In the preferred embodiment of the invention, CLOCK 0 and CLOCK 1 are trains of five volt pulses.

In operation, the CLOCK 0 or the CLOCK 1 is passed to the OUTPUT terminal upon the activation of the boot circuit by means of the control for clock signals appearing on the inputs. The first embodiment for accomplishing the function depicted in FIG. 1 is shown in FIG. 2.

Figure 2:
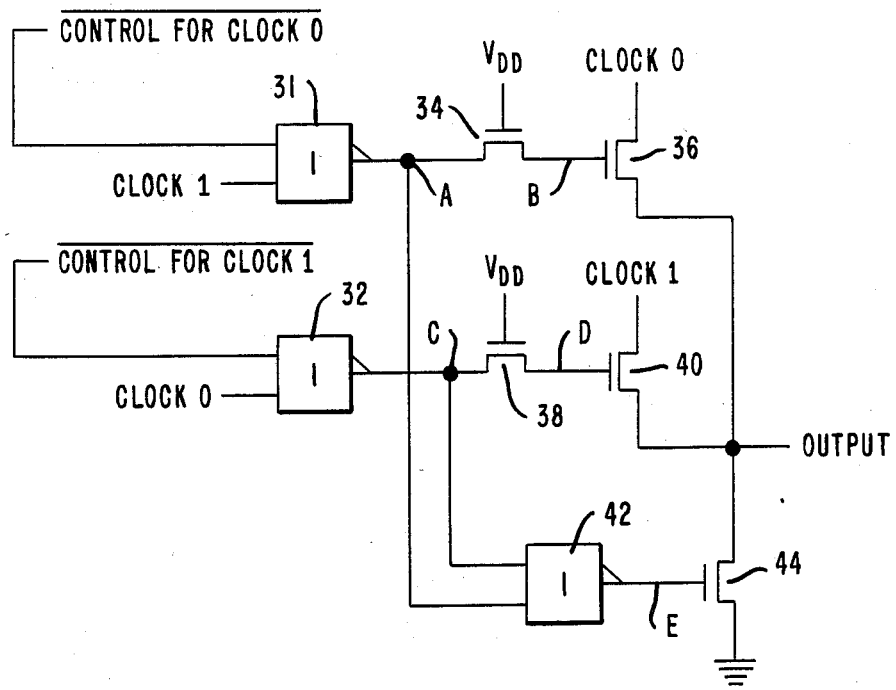
FIG. 2 is a logic diagram partly in circuit form of the preferred embodiment of the present invention.

Referring to FIG. 2, the circuit path of each of the clocking signals is substantially identical. The signal CLOCK 1 is directed to one input of a NOR gate 31. The $\overline{\text{CONTROL FOR CLOCK 0}}$ signal is applied to the other input of NOR gate 31. The output of NOR gate 31 is directed to the source terminal of a MOS device 34, with the drain terminal of the MOS device connected to the gate terminal of MOS device 36. The drain terminal of MOS device 36 is connected to the OUTPUT terminal. The gate of MOS device 34 is connected to an appropriate source of voltage VDD. The source terminal of MOS device 36 is connected to receive the CLOCK 0 signal. In a like manner, the CLOCK 0 signal is applied to one input of a NOR gate 32. The output of NOR gate 32 is connected to the source terminal of a MOS device 38. The CONTROL FOR CLOCK 1 signal is applied to the other input of the NOR gate 32. The gate terminal of the MOS device 38 is connected to the source of voltage VDD. The drain of MOS device 38 is connected to the gate of MOS device 40 with the source terminal of MOS device 40 connected to receive the CLOCK 1 signal. The drain of the MOS device 40 is connected to the OUTPUT terminal. A MOS device 44, connects the OUTPUT terminal to a reference potential, which may be ground, in response to signals appearing on its gate input. A NOR device 42 has one input connected to the output of NOR gate 31 and a second input connected to the output of NOR gate 32. The output of the NOR gate 42 drives the gate of MOS device 44 in response to the signal levels on its input. In operation, when the input signal levels to NOR gate 31 are low, generally ground, the output of NOR gate 31 is high and is directed to the input of the NOR gate 42 which effectively grounds the gate of the MOS device 44 preventing its turn on.

Figure 3:
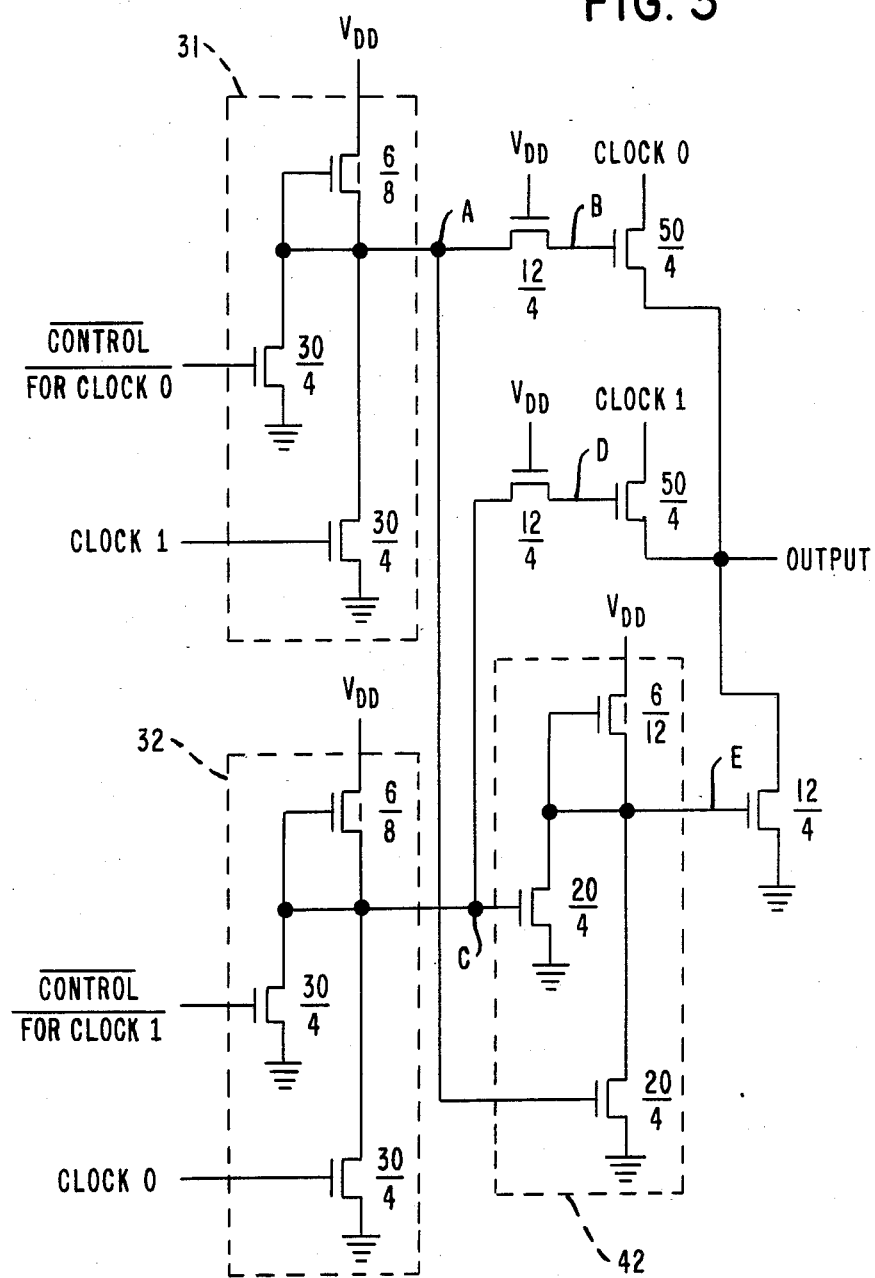
FIG. 3 is a circuit schematic of the preferred embodiment shown in FIG. 2.

Referring now to FIG. 3, the logic circuit diagram of FIG. 2 is converted into a physical circuit diagram with the NOR gate 31, shown as a dotted box, comprised of three MOS transistors having gate width-to-length ratios as shown. The dotted boxes 32 and 42 and the MOS devices therein correspond to the NOR gates 32 and 42, respectively.

Figure 4:
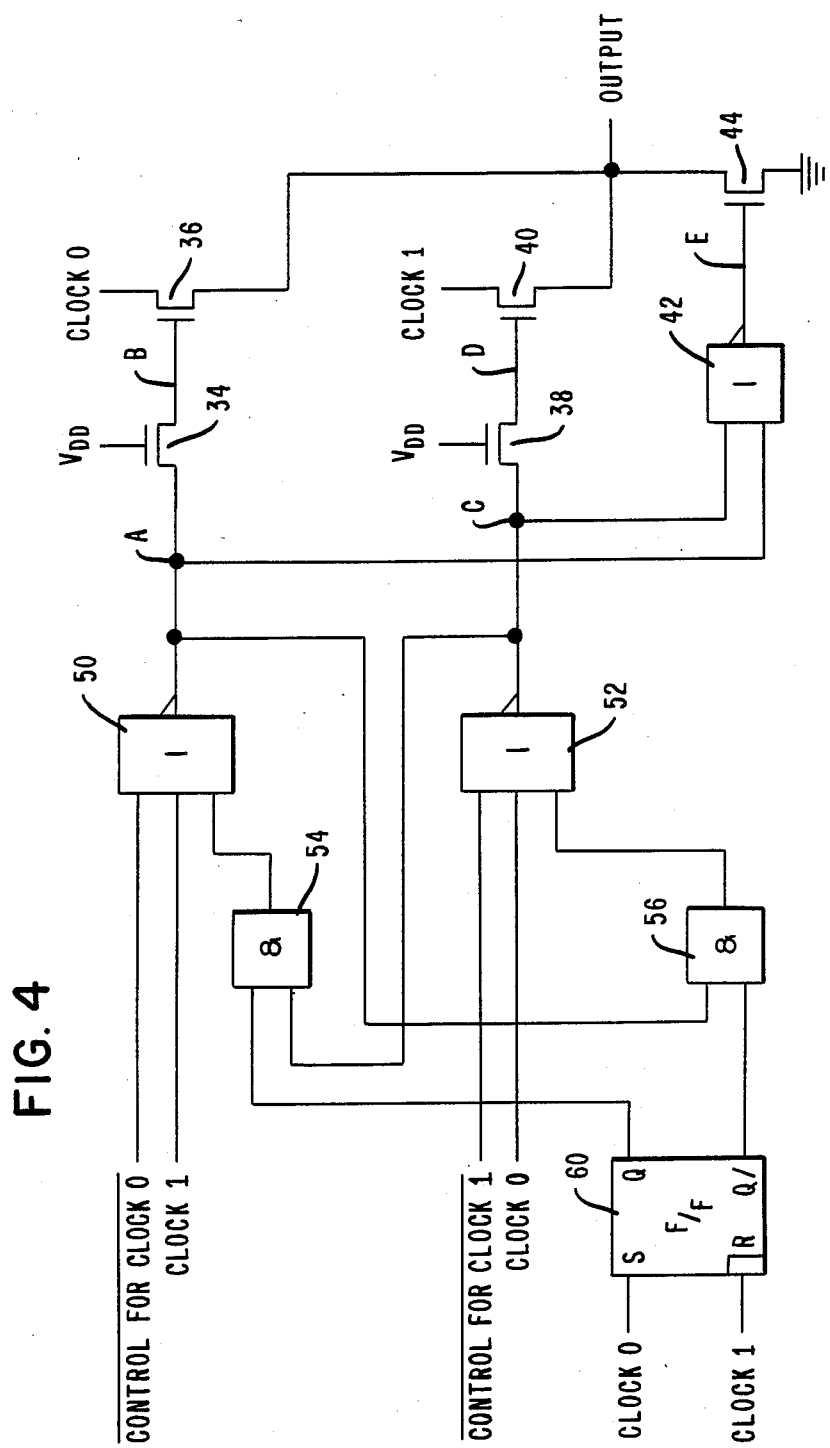
FIG. 4 is a logic diagram partially in circuit form of a second embodiment of the present invention.

FIG. 4 is an enhanced version of the booted clock circuit of FIGS. 2 and 3 configured to prevent the flow of interclock current when both controls for clock signals are on and both clock signals are low. If the low voltage level of the two clock signals is substantially identical, the circuit of FIGS. 2 and 3 will be adequate. In those instances where that condition does not exist, the circuit of FIGS. 4 and 5 will eliminate the interclock current. In FIG. 4, a NOR gate 50, in a cross coupled fashion, receives the output from a NOR gate 52 via an AND gate 54. The signals CLOCK 0 and CLOCK 1 applied to the S and R inputs, respectively, of a flip-flop 60 provide a signal at the the Q output for gating the AND gate 54. The NOR gate 52 receives the output from the NOR gate 50, in a cross coupled fashion, via an AND gate 56 under the gating control of the signal at the Q/ output of flip-flop 60. The enhanced circuit operated to pull down the gate of the boot circuit of the clock signal which has just ended, if the other clock is enabled for booting next. If the second clock boot is not enabled, the enhanced circuit has no effect and the first boot circuit is turned off by the second clock, according to the operation of the circuit of FIGS. 2 and 3.

Figure 5:
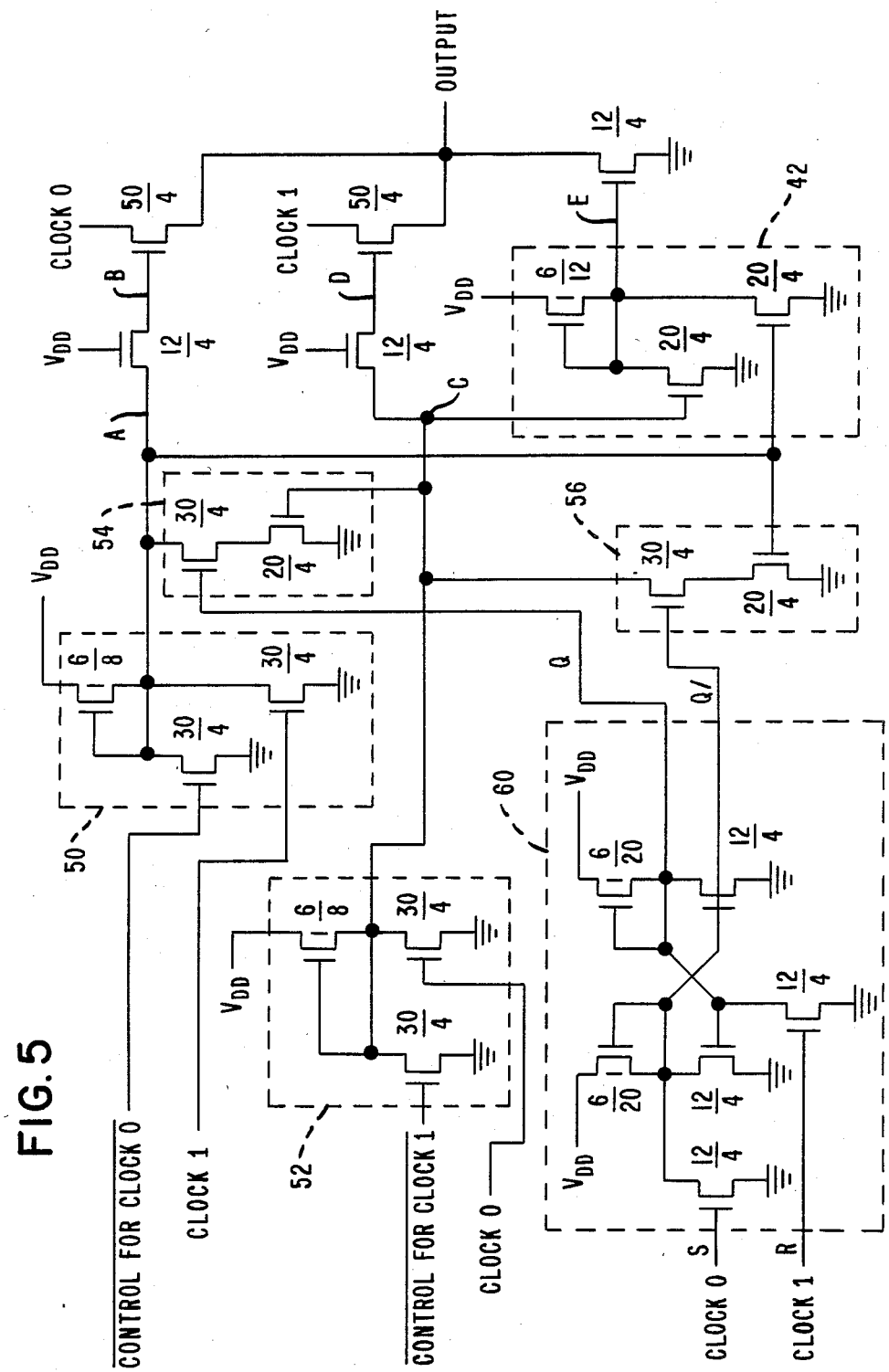
FIG. 5 is a circuit diagram of the second embodiment illustrated in FIG. 4.

Referring now specifically to FIG. 5, the flip-flop circuit 60 is shown implemented with cross-coupled MOS devices having gate inputs labeled S and R and outputs labeled Q and Q/. The flip-flop circuit 60 is implemented using MOS technology with the gate ratios shown in the drawing. The NOR gate 50 and AND gate 54, logic combination of FIG. 4, translate into the circuit hardware combination of the three MOS devices shown in the dotted box 50 and the two MOS devices shown within the dotted box 54. In a like manner the NOR gates, 42 and 52, and the AND gate 56 translate into the circuit combination of the MOS devices shown within the respective dotted boxes.

Figure 6:
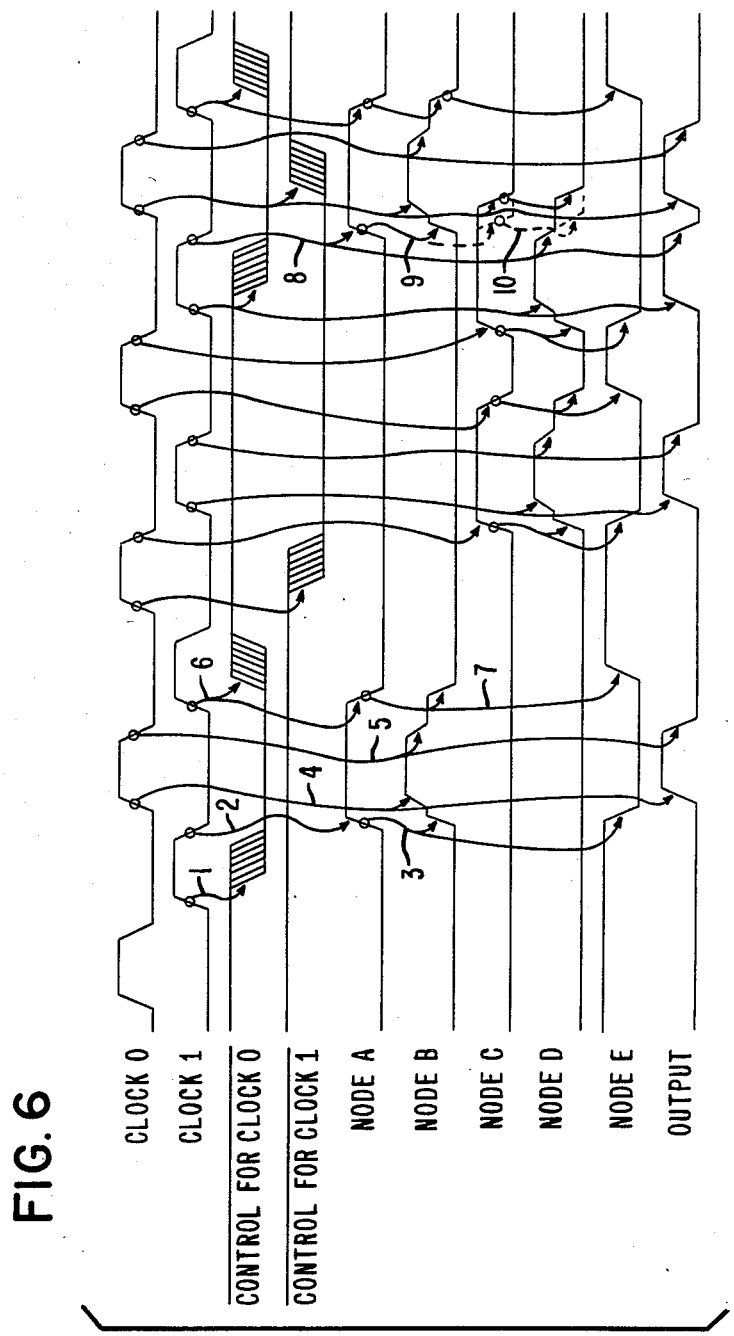
FIG. 6 is a set of waveforms occurring at like labeled points on the embodiments shown in FIGS. 2–5.

Referring now to the timing waveforms of FIG. 6, in conjunction with the circuit shown in FIGS. 2 and 3, for the purpose of running through an operating cycle of the circuit. Each waveform label corresponds to a like labeled physical point on the circuit. The action lines, beginning with a circle and ending with an arrow correspond to cause and effect, i.e., an event occurs at the circled point in time and that event causes a second or more events to occur at a latter point in time, indicated by the arrowed end of the line. Hatched portions of a waveform correspond the "Don't Care" states wherein the event may occur at any time during the hatched portion without affecting the circuit operation. As a starting point for this example both CONTROL FOR CLOCK 0 and CONTROL FOR CLOCK 1 are in their clock blocking state, that is, at a high voltage level. Then driving CLOCK 1 the CONTROL FOR CLOCK 0 input is driven low, as indicated by action line 1, thereby enabling the NOR gate 31 and driving the node A high, upon the transition of the signal CLOCK 1 from a high to a low, as indicated by action line 2. In turn, when the node A is high the node B follows and the output of NOR gate 42, node E, goes low (action line 3). When CLOCK 0 goes high it further boosts the potential on node B, (action line 4). In addition, the OUTPUT goes high, to a level corresponding to the full amplitude of the clock signals. When the CLOCK 0 goes negative (action line 5) node B reduces to its previous voltage level and the OUTPUT drops to a low level. When the next CLOCK 1 pulse goes high (action line 6) node A drops to a low level and node E rises to the high level. The signal CONTROL FOR CLOCK 0 rises from the low level to the high level. The remaining cycles repeat the operation for the second channel containing nodes C and D.

Figure 7:
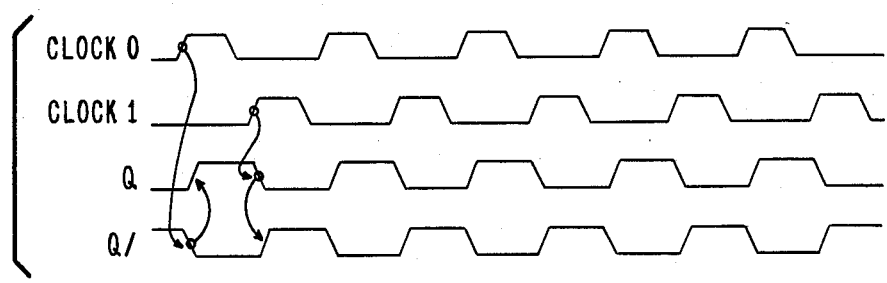
FIG. 7 is a set of waveforms occurring at like labeled points on the embodiment shown in FIGS. 4 and 5.

Referring now to the FIG. 6 and FIG. 7 waveforms in conjunction with the circuit shown in FIGS. 4 and 5. In FIG. 7 when the CLOCK 0 signal applied to the flip-flop 60 goes from a low to a high level the Q/ output goes from high to low and in turn the Q output goes from low to high. When the signal CLOCK 1 goes from a low to a high level the signal Q goes from high to low which in turn causes the signal Q/ to go from a low level to a high level. The Q and Q/ signals are input signals for the AND gates 54 and 56, respectively. These AND gates are connected to the nodal points A and C and affect the operation of the circuit by causing the high level to low level transition to occur sooner than in the preceding circuit embodiment. This operation is shown in FIG. 6 by the action lines 8, 9 and 10 and the dotted sections of the waveforms appearing at node C and at node D. This operation assures that when nodes A and B are rising to a high level nodes C and D are dropping to a low level and vice versa.

Figure 8:
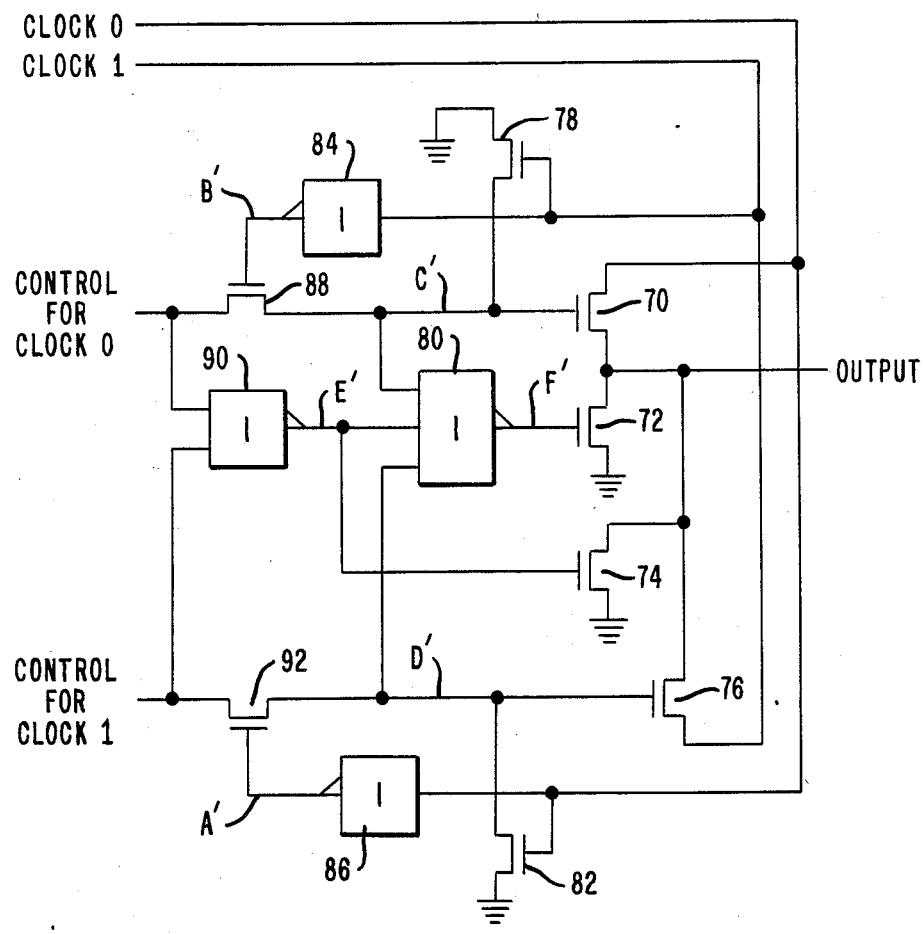
FIG. 8 is a logic diagram partly in circuit form of a third embodiment of the present invention.

Referring now to the third embodiment of the two-clock circuit shown in FIG. 8, the control signals CONTROL FOR CLOCK 0 and CONTROL FOR CLOCK 1, applied as inputs to a NOR gate 90 and to MOS devices 88 and 92, respectively, are not barred as was the case for the preceding embodiments. The signal CLOCK 0 is applied to the source of a MOS device 70, the gate of a MOS device 82, and to the gate of MOS device 92 via an inverter 86. The signal CLOCK 1 is applied to the gate of a MOS device 78, the source of a MOS device 76, and to the gate of the MOS device 88, via the inverter 84. MOS devices 72 and 74 are connected between the OUTPUT terminal and circuit ground. The output of NOR gate 90 is connected to the gate of MOS device 74 and an input to a NOR gate 80. The NOR gate 80 has two other inputs, one connected to the nodal point C' and the other connected to the nodal point D'. The output of NOR gate 80 is coupled to the gate of MOS device 72. The nodal point C' is also connected to the MOS devices 78 and 88 and to the gate of MOS device 70. The nodal point D' is also connected to the MOS devices 82, 92 and to the gate of MOS device 76.

Figure 9:
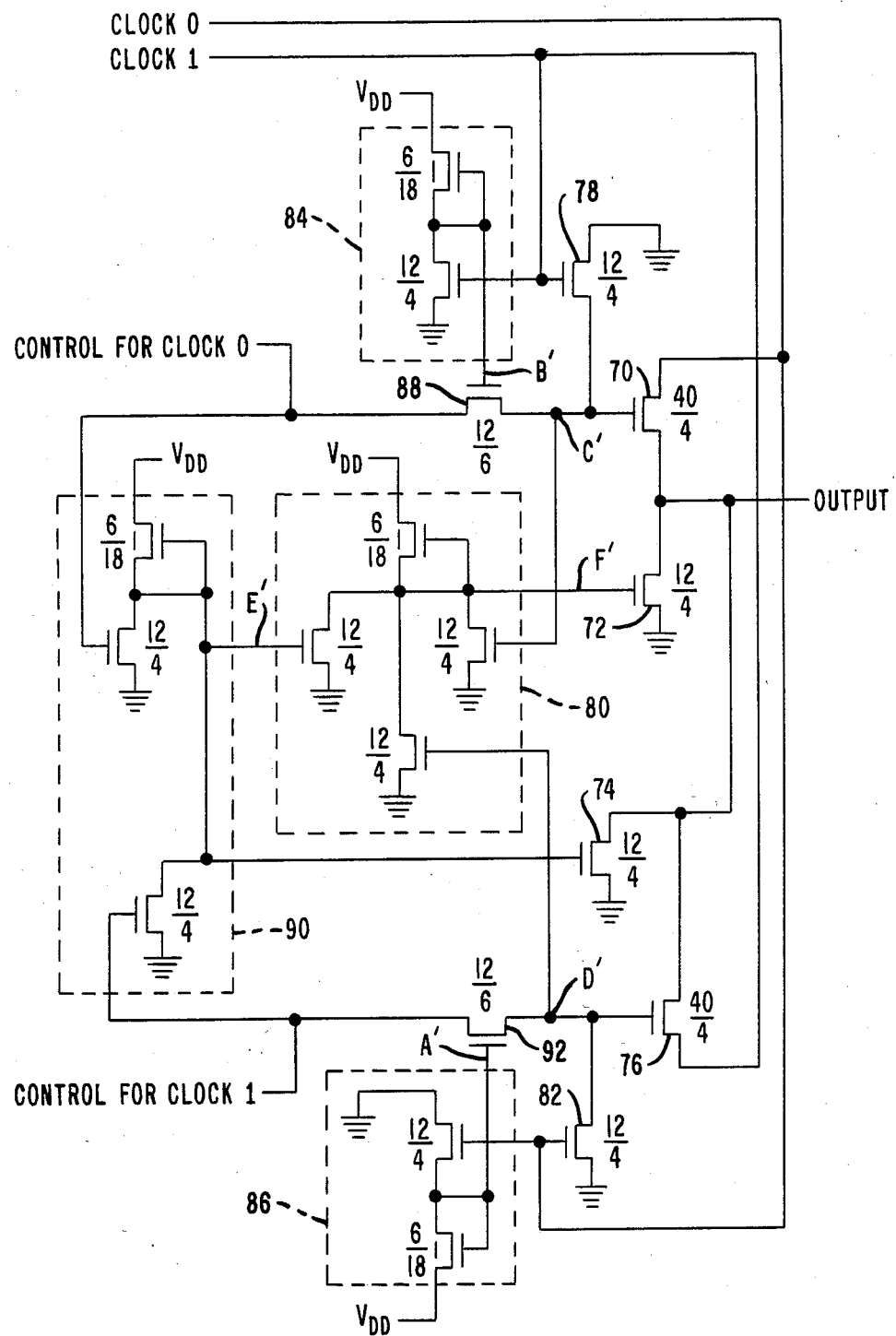
FIG. 9 is a circuit diagram of the third embodiment illustrated in FIG. 8.
Figure 10:
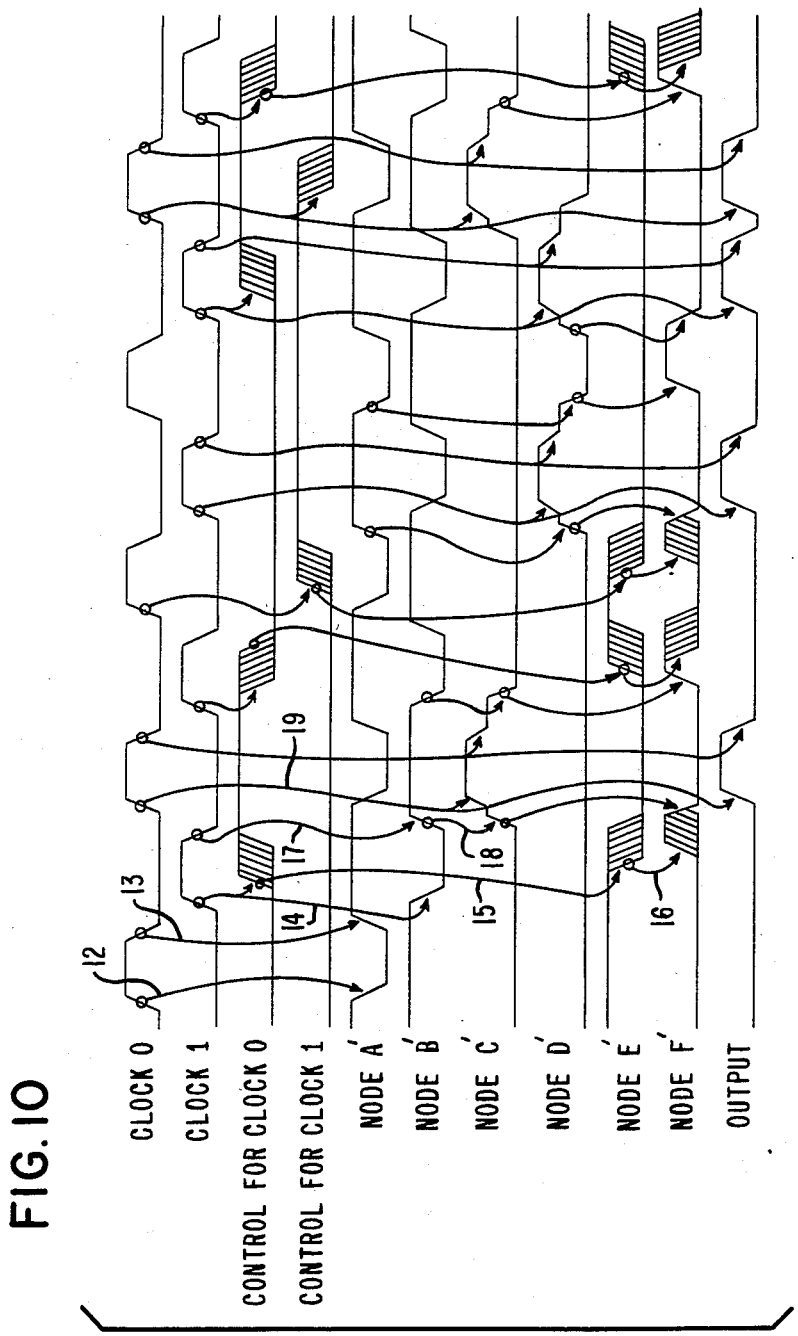
FIG. 10 is a set of waveforms occurring at like labeled points on the third embodiment shown in FIGS. 8 and 9.

Referring to FIG. 9, the two NOR gates 80 and 90, and the two inverters, 84 and 86, are shown translated into the circuit combination of MOS devices shown within the correspondingly labeled dotted boxes. The waveforms of FIG. 10, taken at like labeled physical points on the circuit embodiment of FIGS. 8 and 9, illustrate the various signal timings. Considering FIGS. 8, 9 and 10 together, the signal CLOCK 0, (action line 12), in moving from a low level to a high level causes the potential on node A' to drop. With the signals CONTROL FOR CLOCK 0 and CONTROL FOR CLOCK 1 both low, no further transitions occur. When the signal CLOCK 0 goes from high to low, (action line 13), the potential on node A' rises but no further transitions occur. When the signal CLOCK 1 rises it activates the signal CONTROL FOR CLOCK 0 to a high level and drops the potential on node B' to a low level. The rising of the CONTROL FOR CLOCK 0 signal, (action line 15), causes node E' to go low which in turn (action line 16), causes node F' to rise. When the signal CLOCK 1 goes toward the low level (action line 17) the potential on node B' starts to rise, in turn drawing node C' along (action line 18). When the signal CLOCK 0 goes towards the high level (action line 19) the potential at node C' is boosted higher causing the signal at the OUTPUT to rise to the full potential of the clock signals. The remaining cycles of the circuit are obvious from an inspection of the waveforms in conjunction with the circuit diagrams.

While there has been shown what are considered to be the preferred embodiments of the present invention, it will be manifest that many changes and modifications may be made therein without departing from the essential spirit of the invention. It is intended, therefore, in the annexed claims, to cover all such changes and modifications as may fall within the true scope of the invention.

We claim:
1. A two clock boot circuit comprising:
an output;
first and second non-overlapping clock signals connected to said output by means of first and second MOS devices, respectively;
third and fourth MOS means connected between a supply voltage and said first and said second MOS devices, respectively, for booting the first and the second non-overlapping clock signals;
logic means connected to said third and said fourth MOS means and responsive to first and second control signals for controlling the conduction of said third and said fourth MOS means for exclusively selecting said first or said second non-overlapping clock signals to be applied to said output; and
means for connecting said output to a reference potential in response to said logic means providing a signal corresponding to a low level in the signal appearing at said output.

2. The two clock boot circuit according to claim 1 wherein said logic means is comprised of:
a first logic means for actuating said third MOS means in response to a first control signal; and
a second logic means for actuating said fourth MOS means in response to a second control signal.

3. The two clock boot circuit according to claim 2 wherein said first and said second logic means have inputs and actuate said third and said fourth MOS means respectively with output signals in response to the logical combination of the signals applied to their inputs, and further comprising:
dual gating means connected to receive said first and said second non-overlapping clock signals and the output signals from said first logic means and said second logic means for cross-coupling the output signals from said first and said second logic means to the inputs to said second and said first logic means, respectively in response to the state of said first and said second non-overlapping clock signals.

4. The two clock boot circuit according to claim 3 wherein said gating means is comprised of:
a first logic gate having an output coupled to an input to said first logic means and an input coupled to an output of said second logic means;
a second logic gate having an output coupled to an input to said second logic means and an input coupled to an output of said first logic means; and
flip-flop means receiving as inputs the first and second non-overlapping clock signals and having a first output connected to an input to said first logic gate and a second output connected to an input to said second logic gate for insuring non-overlapping actuation of said first and said second MOS devices.

5. A booting circuit for operating upon two non-overlapping clock signals comprising:
an output terminal;
a first MOS transistor having a source, drain and gate with said source and drain connected between said output terminal and a terminal for receiving a first clock signal;
a second MOS transistor having a source, drain and gate with said source and drain connected between said output terminal and a terminal for receiving a second non-overlapping clock signal;
a third and fourth MOS transistor each having a source, drain and gate with the gates thereof connected to a supply voltage and the drain of said third and said fourth MOS transistor connected to the gate of said first and said second MOS transistor, respectively;
a fifth MOS transistor having a source, drain and gate with said source and drain connected between said output terminal and a reference potential;
a first NOR gate, receiving as inputs a first control signal and the second non-overlapping clock signal for selecting the first clock signal to appear on said output terminal, the output of said first NOR gate connected to the source of said third MOS transistor;
a second NOR gate, receiving as inputs a second control signal and the first clock signal for selecting the second clock signal to appear on said output terminal, the output of said second NOR gate connected to the source of said fourth MOS transistor;

a third NOR gate, having a first and a second input and an output with said first input connected to the source of said third MOS transistor and said second input connected to the source of said fourth MOS transistor, and said output connected to the gate of said fifth MOS transistor for activating said fifth MOS transistor in response to the signals on said first and said second inputs.

6. The booting circuit according to claim 5 and further comprising:

two means for cross-coupling the output from said first NOR gate and said second NOR gate to an input of said second NOR gate and said first NOR gate, respectively in response to the state of said first and said second non-overlapping clock signals.

7. The booting circuit according to claim 6 wherein said means for cross-coupling is comprised of:

a first AND gate having an output coupled to an input to said first NOR gate and an input coupled to the output of said second NOR gate;

a second AND gate having an output coupled to an input to said second NOR gate and an input coupled to the output of said first NOR gate; and flip-flop means receiving as inputs the first and the second non-overlapping clock signals and having a first output connected as an input to said first AND gate and a second output connected as an input to said second AND gate for insuring non-overlapping activation of said first and said second MOS transistors.

8. A two clock boot circuit comprising:

an output;

a reference point;

a first and a second MOS device, each having a source, drain and gate;

first and second non-overlapping clock signals connected to said output by means of said first and said second MOS devices;

a third and a fourth MOS device, each having a source, drain and gate with said source and said drain connected between said output and said reference point;

a fifth and a sixth MOS device, each having a source, drain and gate;

a first and a second control signal input connected by means of said fifth and said sixth MOS device to the gate of said first and said second MOS device, respectively;

a first NOR gate having one input connected to said first control signal input and a second input connected to said second control signal input, and an output connected to the gate of said fourth MOS device;

a second NOR gate having one input connected to the output of said first NOR gate, a second input connected to the gate of said first MOS device, a third input connected to the gate of said second MOS device, and an output connected to the gate of said third MOS device;

a first inverter, having an input and an output with its input connected to said first non-overlapping clock signal and its output connected to the gate of said sixth MOS device;

a second inverter, having an input and an output with its input connected to said second non-overlapping clock signal and its output connected to the gate of said fifth MOS device;

a seventh MOS device having a source, drain and gate with said source and said drain connected between the gate of said first MOS device and said reference point and its gate connected to the input of said second inverter; and an eighth MOS device having a source, drain and gate with said source and said drain connected between the gate of said second MOS device and said reference point and its gate connected to the input of said first inverter.

* * * * *